United States Patent [19]
Liu

[11] Patent Number: 5,576,242
[45] Date of Patent: Nov. 19, 1996

[54] METHOD OF FORMING SELF-ALIGNED BURIED CONTACT

[75] Inventor: Ming-Hua Liu, Tai-Chung, Taiwan

[73] Assignee: United Microelectronics Corp., Taiwan

[21] Appl. No.: 573,962

[22] Filed: Dec. 15, 1995

[51] Int. Cl.$^6$ ................................................ H01L 21/44
[52] U.S. Cl. ........................... 437/191; 437/193; 437/195
[58] Field of Search .................................... 437/191, 193, 437/195, 186, 203

[56] References Cited

U.S. PATENT DOCUMENTS

| | | | |
|---|---|---|---|
| 4,656,732 | 4/1987 | Teng et al. | 437/193 |
| 4,910,168 | 3/1990 | Tsai | 437/193 |
| 5,236,867 | 8/1993 | Fusuta et al. | 437/193 |
| 5,318,925 | 6/1994 | Kim | 437/195 |
| 5,427,980 | 6/1995 | Kim | 437/195 |
| 5,494,848 | 2/1996 | Chin | 437/191 |
| 5,525,552 | 6/1996 | Huang | 437/195 |

*Primary Examiner*—Tuan H. Nguyen
*Attorney, Agent, or Firm*—Brumbaugh, Graves, Donohue & Raymond

[57] ABSTRACT

Disclosed is a method of forming self-aligned buried contact implementing self-alignment technology into buried contact process to prevent failure of semiconductor elements due to disconnection of wiring which is caused by misalignment. This is done by forming a sidewall spacer in the recess on the buried contact region. The tolerance of misalignment is greatly increased because a polysilicon layer will contact with the buried contact region if the polysilicon layer could contact the sidewall spacer.

11 Claims, 5 Drawing Sheets

METHOD OF FORMING SELF-ALIGNED BURIED CONTACT

FIELD OF THE INVENTION

The present invention relates to a method of forming a buried contact, especially to a method of forming a self-aligned buried contact of a metal-oxide semiconductor field effect transistor (MOSFET) in a high density integrated circuit.

BACKGROUND OF THE INVENTION

Generally speaking, in the process of fabricating MOSFET in high density integrated circuit, polysilicon is often used as conducting wires between MOSFET elements to reduce the use of metal wires, therefore it is necessary to use buried contact structure. Conventional buried contact process is illustrated in FIGS. 1a to 1e which show the cross-sectional view of each step.

As shown in FIG. 1a, a field oxide 10 and a gate oxide 11 are grown on a silicon substrate 1. After a first polysilicon layer 12 and a first photoresist 13 are deposited, a buried contact region 14 is formed by defining the first photoresist 13 and etching.

As shown in FIG. 1b, the first photoresist 13 is removed to finish buried contact etch, then a second polysilicon layer 15 is deposited. Impurities could be implanted and driven in to improve the conductivity of the second polysilicon layer 15.

FIG. 1c shows a tungsten silicate ($WSi_x$) layer 16 is deposited.

FIG. 1d shows that a second photoresist 17 is deposited and defined.

As shown in FIG. 1e, a buried contact region 18 is formed by anisotropic etching, and then the second photoresist 17 is removed.

Another conventional buried contact process is shown in FIGS. 2a to 2d. It is different from the above-mentioned process because tungsten silicate layer is not used. For convenience, corresponding elements use same numerals in all embodiments.

As shown in FIG. 2a, a field oxide 10 and a gate oxide 11 are grown on a silicon substrate 1. After a first polysilicon layer 12 and a first photoresist 13 are deposited, a buried contact region 14 is formed by defining the first photoresist 13 and etching.

As shown in FIG. 2b, the first photoresist 13 is removed to finish buried contact etch, then a second polysilicon layer 15 is deposited. Impurities could be implanted and driven in to improve the conductivity of the second polysilicon layer 15.

FIG. 2c shows that a second photoresist 17 is deposited and defined.

As shown in FIG. 2d, a buried contact region 18 is formed by anisotropic etching, and then the second photoresist 17 is removed.

The most often encountered problem of the conventional buried contact process is that although conducting wires are formed between MOSFET elements by polysilicon, if the misalignment of definition of the second photoresist is too large, the polysilicon layer 15 will not contact with the buried contact region 18 which leads to disconnection of wiring and therefore induces failure of the MOSFET elements.

SUMMARY OF THE INVENTION

It is therefore an object for the present invention to provide a method of forming a buried contact, using self-alignment technique to prevent failure of semiconductor elements due to disconnection of wiring which is caused by misalignment.

The object of the present invention is fulfilled by providing a method for forming a self-aligned buried contact on a semiconductor substrate having a field oxide and a gate oxide grown thereon and a first polysilicon layer deposited thereon and a buried contact region formed thereon by etching, comprising the following steps of: depositing a second polysilicon layer thereon while forming a recess on the buried contact region; forming a sidewall spacer within the recess; depositing a tungsten silicate layer thereon; depositing and defining a second photoresist thereon; anisotropically etching the tungsten silicate layer and the second polysilicon layer; and removing the second photoresist.

BRIEF DESCRIPTION OF THE DRAWING

The present invention will be more fully understood from the detailed description given hereinafter with reference to and the accompanying drawings which are given by way of illustration only, and thus are not limitative of the present invention and wherein.

DETAILED DESCRIPTION OF THE PREFERRED EMBODIMENT

A preferred embodiment of the present invention is illustrated in FIGS. 3a to 3f and described hereinafter.

Step 1

Figure 1A:
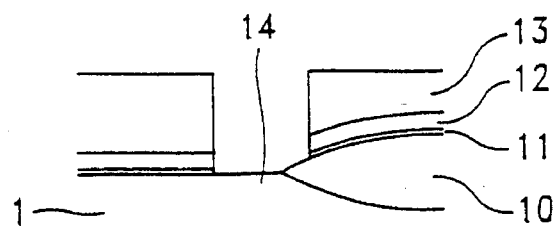
FIGS. 1a to 1e show cross-sectional views of a conventional buried contact process.
Figure 1B:
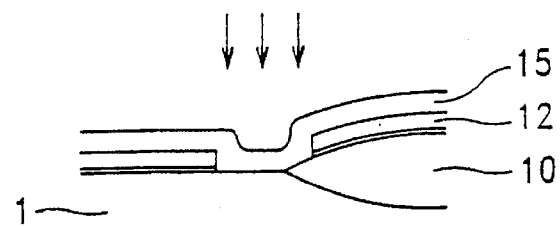
Figure 1C:
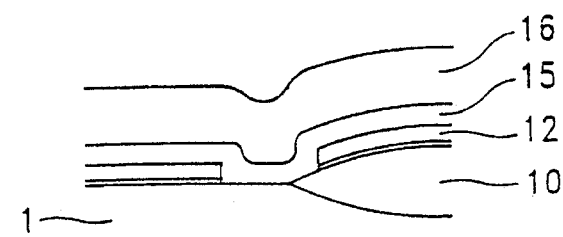
Figure 1D:
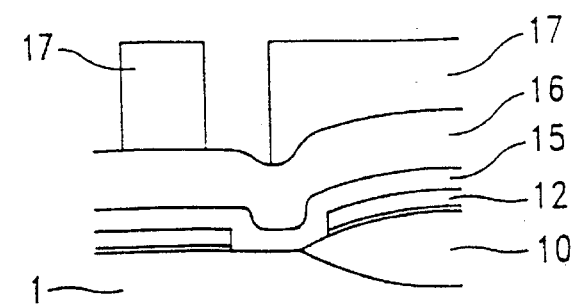
Figure 1E:
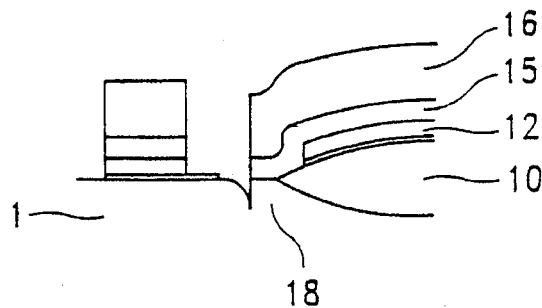
Figure 2A:
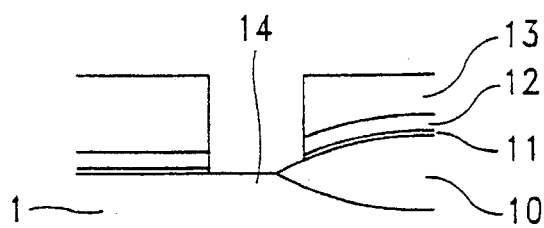
FIGS. 2a to 2d show cross-sectional views of another conventional buried contact process.
Figure 2B:
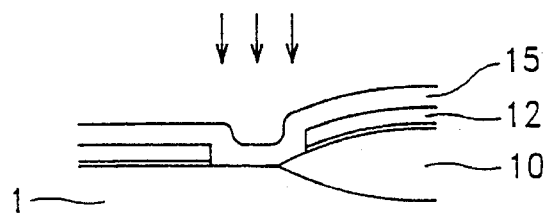
Figure 2C:
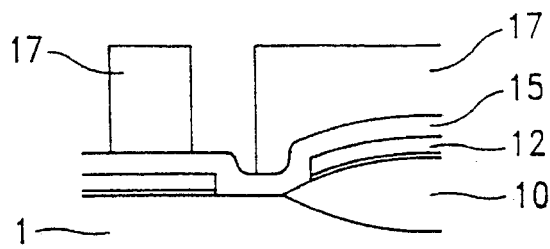
Figure 2D:
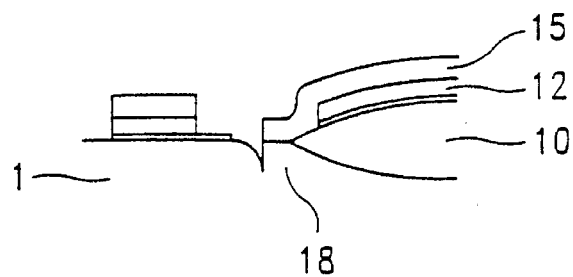
Figure 3A:
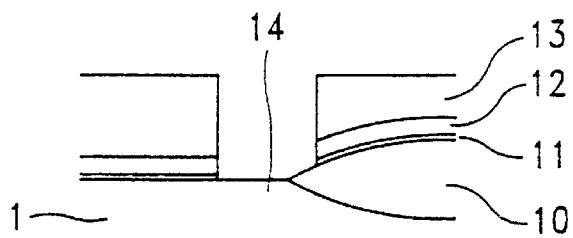
FIGS. 3a to 3f show cross-sectional views of an embodiment of the self-aligned buried contact process according to the present invention.

As shown in FIG. 3a, a field oxide 10 and a gate oxide 11 are grown on a silicon substrate 1. After a first polysilicon layer 12 and a first photoresist 13 are deposited, a buried contact region 14 is formed by defining the first photoresist 13 and etching.

Step 2

Figure 3B:
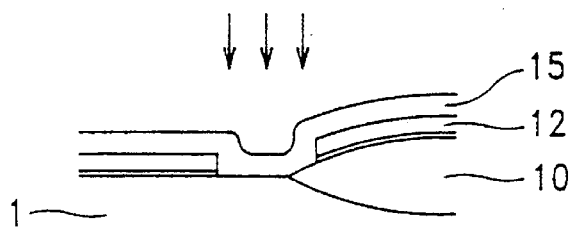

As shown in FIG. 3b, the first photoresist 13 is removed to finish buried contact etch, then a second polysilicon layer 15 is deposited. Impurities could be implanted and driven in to improve the conductivity of the first polysilicon layer 12.

Step 3

Figure 3C:
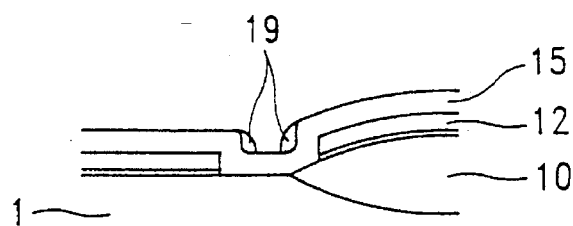

As shown in FIG. 3c, a sidewall spacer 19 is formed in a recess of the second polysilicon layer 15 above the buried contact region 14. This could be done by depositing a silicon dioxide layer or a silicon nitride layer with a thickness of 1 KÅ to 1.5 KÅ, and etching back using anisotropic etching technique.

Step 4

Figure 3D:
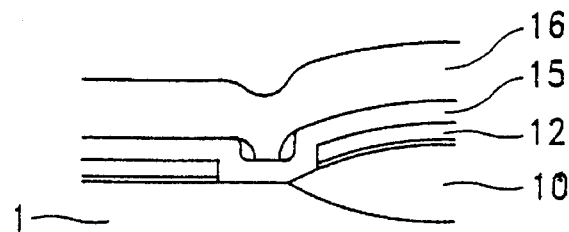

FIG. 3d shows a tungsten silicate layer 16 having a thickness of 1 KÅ to 1.5 KÅ is deposited.

Step 5

Figure 3E:
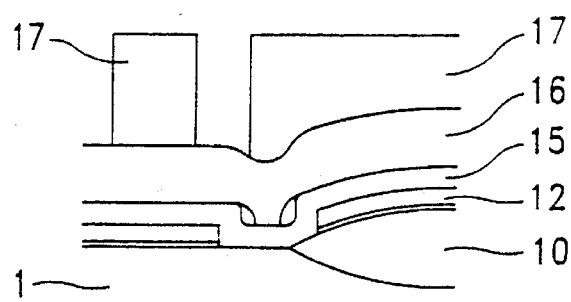

FIG. 3e shows that a second photoresist 17 is deposited and defined.

Step 6

Figure 3F:
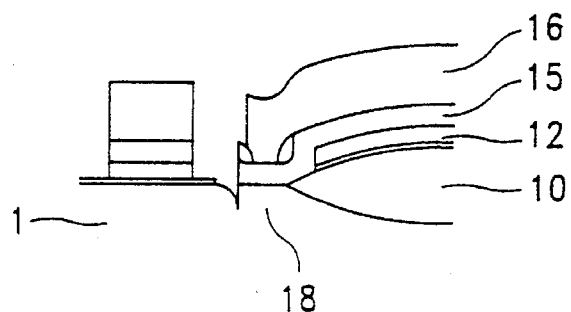

As shown in FIG. 3f, a buried contact region 18 is formed by anisotropic etching, and then the second photoresist 17 is removed.

Another preferred embodiment of the self-aligned buried contact process according to the present invention is illustrated in FIGS. 4a to 4e and described hereinafter.

Step 1

Figure 4A:
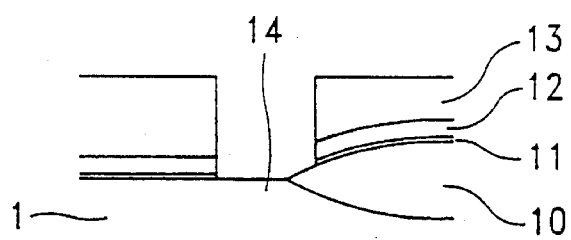
FIGS. 4a to 4e show cross-sectional views of another embodiment of the self-aligned buried contact process according to the present invention.

As shown in FIG. 4a, a field oxide 10 and a gate oxide 11 are grown on a silicon substrate 1. After a first polysilicon layer 12 and a first photoresist 13 are deposited, a buried contact region 14 is formed by defining the first photoresist 13 and etching.

Step 2

Figure 4B:
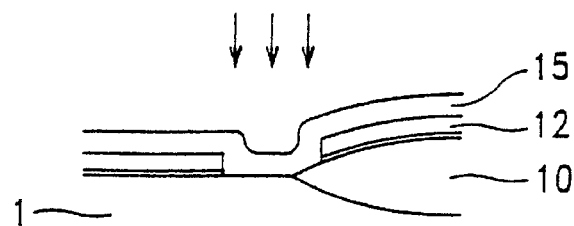

As shown in FIG. 4b, the first photoresist 13 is removed to finish buried contact etch, then a second polysilicon layer 15 is deposited. Impurities could be implanted and driven in to improve the conductivity of the first polysilicon layer 12.

Step 3

Figure 4C:
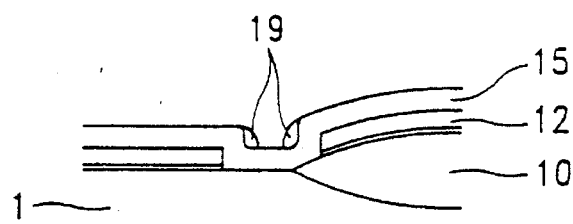

As shown in FIG. 4c, a sidewall spacer 19 is formed in a recess of the second polysilicon layer 15 above the buried contact region 14. This could be done by depositing a silicon dioxide layer or a silicon nitride layer with a thickness of 1 KÅ to 1.5 KÅ, and etching back using anisotropic etching technique.

Step 4

Figure 4D:
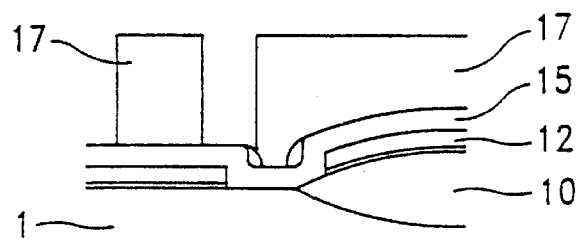

FIG. 4d shows that a second photoresist 17 is deposited and defined.

Step 5

Figure 4E:
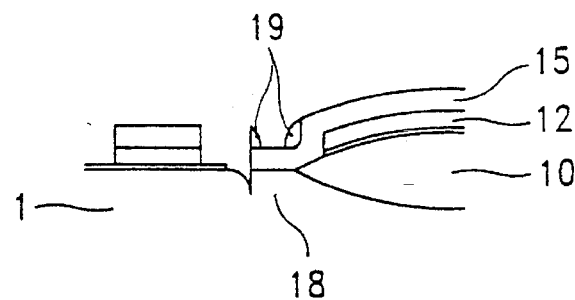

As shown in FIG. 4e, a buried contact region 18 is formed by anisotropic etching, and then the second photoresist 17 is removed.

As stated above, since a sidewall spacer is formed above the buried contact region in the buried contact process according to the present invention, the tolerance of misalignment is greatly increased because the polysilicon layer will contact with the buried contact region if the polysilicon layer could contact the sidewall spacer, so that self-alignment is achieved and the problem of disconnection in the conventional buried contact process is reduced.

While the invention has been described by way of examples and in terms of several preferred embodiments, it is to be understood that the invention need not be limited to the disclosed embodiment. On the contrary, it is intended to cover various modifications and similar arrangements included within the spirit and scope of the appended claims, the scope of which should be accorded the broadest interpretation so as to encompass all such modifications and similar structures.

What is claimed:

1. A process for forming self-aligned buried contact on a semiconductor substrate having a field oxide and a gate oxide grown thereon and a first polysilicon layer deposited thereon and a buried contact region formed thereon by etching, comprising the following steps of:

depositing a second polysilicon layer thereon while forming a recess on the buried contact region;

forming a sidewall spacer within said recess;

depositing a tungsten silicate layer thereon;

depositing and defining a second photoresist thereon;

anisotropically etching said tungsten silicate layer and said second polysilicon layer; and removing said second photoresist.

2. A process for forming self-aligned buried contact on a semiconductor substrate as claimed in claim 1, wherein impurities are implanted and driven in after depositing said second polysilicon layer to improve the conductivity of said second polysilicon layer.

3. A process for forming self-aligned buried contact on a semiconductor substrate as claimed in claim 1, wherein said step of forming the sidewall spacer includes depositing a silicon dioxide layer thereon and etching back.

4. A process for forming self-aligned buried contact on a semiconductor substrate as claimed in claim 3, wherein the thickness of said silicon dioxide layer is 1 KÅ to 1.5 KÅ.

5. A process for forming self-aligned buried contact on a semiconductor substrate as claimed in claim 1, wherein said step of forming the sidewall spacer includes depositing a silicon nitride layer thereon and etching back.

6. A process for forming self-aligned buried contact on a semiconductor substrate as claimed in claim 5, wherein the thickness of said silicon nitride layer is 1 KÅ to 1.5 KÅ.

7. A process for forming self-aligned buried contact on a semiconductor substrate having field oxide and gate oxide grown thereon and a first polysilicon layer deposited thereon and a buried contact region formed thereon by etching, comprising the following steps of:

depositing a second polysilicon layer thereon while forming a recess on the buried contact region;

forming a sidewall spacer within said recess;

depositing and defining a second photoresist thereon;

anisotropically etching said second polysilicon layer; and removing said second photoresist.

8. A process for forming self-aligned buried contact on a semiconductor substrate as claimed in claim 7, wherein said step of forming the sidewall spacer includes depositing a silicon dioxide layer thereon and etching back.

9. A process for forming self-aligned buried contact on a semiconductor substrate as claimed in claim 8, wherein the thickness of said silicon dioxide layer is 1 KÅ to 1.5 KÅ.

10. A process for forming self-aligned buried contact on a semiconductor substrate as claimed in claim 7, wherein said step of forming the sidewall spacer includes depositing a silicon nitride layer thereon and etching back.

11. A process for forming self-aligned buried contact on a semiconductor substrate as claimed in claim 10, wherein the thickness of said silicon nitride layer is 1 KÅ to 1.5 KÅ.

* * * * *